United States Patent [19]
Yang

[11] Patent Number: 5,588,015
[45] Date of Patent: Dec. 24, 1996

[54] LIGHT EMITTING DEVICES BASED ON INTERBAND TRANSITIONS IN TYPE-II QUANTUM WELL HETEROSTRUCTURES

[75] Inventor: Rui Q. Yang, Houston, Tex.

[73] Assignee: University of Houston, Houston, Tex.

[21] Appl. No.: 518,101

[22] Filed: Aug. 22, 1995

[51] Int. Cl.$^6$ .................................................. H01S 3/19
[52] U.S. Cl. .................... 372/45; 257/22; 257/97
[58] Field of Search ................ 372/45, 44; 257/15, 257/18, 22, 97

[56] References Cited

U.S. PATENT DOCUMENTS

| | | | |
|---|---|---|---|
| 5,079,601 | 1/1992 | Esaki et al. | 257/97 |
| 5,128,728 | 7/1992 | Liu | 257/22 |
| 5,416,338 | 5/1995 | Suzuki et al. | 257/97 X |
| 5,483,547 | 1/1996 | Adams et al. | 257/97 X |
| 5,509,024 | 4/1996 | Bour et al. | 372/45 |
| 5,521,935 | 5/1996 | Irikawa | 372/45 |

OTHER PUBLICATIONS

F. Capasso et al., Hot Topics, Quantum Cascade Laser: A New Class of Unipolar Semiconductor Lasers for the Mid to Far Infrared Wavelength Region, Aug. 1994, IEEE LEOS Newsletter, pp. 10–13.

Jerome Faist et al., Quantum Cascade Laser, Apr. 22, 1994, Science, vol. 264, pp. 553–555.

Gary Taubes, A New Laser Promises to Put An End to Band Gap Slavery, Research News (No Date).

Tim Folger, Electrons Descending a Staircase, Discover, The World of Science, Jan. 1995 vol. 16 No. 1, pp. 45–47.

Rui Q. Yang, Infrared Laser Based on Intersubband Transitions in Quantum Wells, Superlattices and Microstructures, vol. 17, No. 1, 1995, pp. 77–83.

L. Esaki et al., Polytype Superlattices and Multi–Heterojunctions,, Japanese Journal of Applied Physics, vol. 20, No. 7, Jul. 1981, pp. L529–L532.

Federico Capasso et al., Resonant Tunneling Through Double Barriers, Perpendicular Quantum Transport Phenomona in Superlattices, and Their Device Applications; IEEE Journal of Quantum Electronics, vol. QE–22, No. 9, Sep. 1986, pp. 1853–1869.

Perng–fei Yuh et al., Novel Infrared Band–Aligned Superlattice Laser, Appl. Phys. Lett. 51 (1B), 2 Nov. 1987, pp. 1404–1406.

(List continued on next page.)

*Primary Examiner*—James W. Davie
*Attorney, Agent, or Firm*—Pravel, Hewitt, Kimball & Krieger

[57] ABSTRACT

The present invention relates to quantum well semiconductor light emitting devices such as lasers that utilize resonant tunneling for carrier injection and spatially-diagonal transitions between an energy state in the conduction band of one quantum well and an energy state in the valence band of the adjacent quantum well for light emission, resulting in much improvement in both radiative efficiency and carrier injection efficiency. An elementary structure of the invented devices comprises two spatially coupled quantum wells residing in conduction and valence bands respectively wherein the valence band-edge in one quantum well is higher than the conduction band-edge of the other quantum well. Each quantum well contains at least one energy state formed by the quantum size effect. Light emission occurs by the transition of electrons from the state which is higher in energy in the conduction band quantum well to the state in the valence band quantum well, and the emission wavelength is inversely proportional to the energy difference between the two states which can be easily tailored by adjusting quantum well thicknesses. Cascade emission is realized in a superlattice structure which is constructed by periodically stacking many repeated elementary device structures.

21 Claims, 4 Drawing Sheets

OTHER PUBLICATIONS

M. Helm et al., Intersubband Emission From Semiconductor Superlattices Excited by Sequential Resonant Tunneling, Physical Review Letters, vol. 63, No. 1, 3 Jul. 1989, pp. 74–77.

Rui Q. Yang et al., Population Inversion Through Resonant Interband Tunneling, Appl. Phys. Lett. 59 (2), Jul. 8, 1991, pp. 181–182.

A. Kastalsky et al., Possibility of Infrared Laser in a Resonant Tunneling Structure; Appl. Phys. Lett. 59 (21), Nov. 18, 1991, pp. 2636–2638.

LIGHT EMITTING DEVICES BASED ON INTERBAND TRANSITIONS IN TYPE-II QUANTUM WELL HETEROSTRUCTURES

Foreign priority benefits under Title 35, U.S. Code §119 are claimed for Canada Application No. 2,150,499, filed May 30, 1995.

FIELD OF THE INVENTION

This invention relates to semiconductor light emitting devices and more particularly, to quantum well semiconductor light emitting devices having improved radiative efficiency, wavelength tuning and carrier injection efficiency.

BACKGROUND OF THE INVENTION

The emission wavelength of the semiconductor light emitting devices such as lasers developed to date is mainly in the near infrared (IR). This is limited by the band-gap of the semiconductor material in the active region where the stimulated recombination of electrons and holes across the band-gap gives the emission of electromagnetic radiation. Longer wavelength semiconductor light sources, particularly in naturally occurring atmospheric IR transmission bands (3–5 µm and 8–12 µm), are demanded by many military and civilian applications such as free-space communications, medical diagnostics, atmospheric pollution monitoring, and IR radar for aircraft and automobiles. There have been many attempts devoted to developing long wavelength IR sources by employing intersubband transitions in artificial quantum well (QW) semiconductor heterostructures since an original proposal by Kazarinov et al. in Soviet Phys. Semicond. Vol. 5 (4), 1971. The wavelength of such an IR source due to intersubband transition is determined, not by the band-gap, but by the smaller energy separation of conduction subbands arising from quantum confinement in QW heterostructures made from relatively wide band-gap semiconductor materials. Therefore, the emission wavelength can be tailored over a wide spectral range from mid-IR to sub-millimeter by merely changing QW layer thickness. One recent development in such an intersubband light emitting device is reported by Faist et al. in Science, Vol. 264, pp. 553–556, Apr. 22, 1994 and in Electronics Letters, Vol. 30 (11), 1994, who demonstrate a so called quantum cascade laser which consists of 500 layers, some as thin as 0.8 nm.

A difficulty associated with prior art intersubband light emitting devices is that a high carrier injection efficiency is hard to achieve without reducing population inversion which is essential to lasing action. Such a difficulty would also limit the practical range of wavelength tuning. An issue of more concern for intersubband light emitting devices is that the electron non-radiative relaxation between subbands with energy separation higher than the optical phonon energy (~30 meV) is very fast due to optical phonon scattering, and its typical relaxation time (~1 ps) is at least three order of magnitude smaller than the radiative time (>1 ns), resulting in a very low radiative efficiency ($<10^{-3}$). There is a need for a QW semiconductor IR source having a improved radiative efficiency by suppressing non-radiative relaxation loss, and a high carrier injection efficiency without difficulties and restrictions in practical implementation.

SUMMARY OF THE INVENTION

The invented semiconductor light emitting devices comprise two spatially coupled active QW regions residing in conduction and valence bands respectively, where the valence band-edge in one QW is higher in energy than the conduction band-edge of the other QW. This unique band-edge alignment between the two QWs provides a novel way to establishing efficient population inversion with a high carrier injection efficiency, and to easily manipulating transition rates and tuning emission wavelength in a broad range. The two coupled active QW regions are sandwiched between cladding layers that serve as the emitter/collector and are separated from the quantum well regions by thin tunnel barriers. Each QW region contains at least one energy state formed by the quantum size effect. The energy state in the conduction band QW is higher in energy than the energy state in the spatially adjacent valence band QW.

Under an appropriate bias, each of the above mentioned two energy states residing within the allowed energy bands of the adjacent cladding layer and simultaneously residing within at least one of the band-gaps of the adjacent quantum well region and the other cladding region, electrons are injected from the emitter to the energy state in the conduction band QW. These electrons cannot travel directly to the collector at that high energy level because the energy level resides in at least one of the band-gaps of the adjacent quantum well region and the collector layer. The electrons relax to the lower energy state in the valence band of the adjacent QW thereby causing light to be emitted at a wavelength inversely proportional to the difference in energy of the two states. Since the lower energy level lies in the allowed energy band of the collector layer, the electrons then travel through to the collector layer. The electrons at the lower energy level are prevented from traveling back to the emitter region because the lower energy level resides in at least one of the band-gaps of the adjacent quantum well region and the emitter layer.

The light emitting devices of the present invention utilize spatially-diagonal transitions between an energy state in the conduction band of one QW and an energy state in the valence band of the adjacent QW, which differ from either the conventional intraband resonant schemes as reported by Faist et al. in Science, Vol. 264, Apr. 22, 1994 or an interband resonant tunneling approach based on intrawell intersubband transitions as shown by Yang et al. in Applied Physics Letters, Vol. 59 (2), 1994 and by Esaki et al. in U.S. Pat. No. 5,079,601, leading to an improved radiative efficiency since the non-radiative relaxation via optical phonon scattering will be suppressed in the interband transitions. The present invention provides a system in which sufficient population inversion and efficient carrier injection can be more easily realized, and which has a greater tolerance in practical implementation, facilitating customization to a wide wavelength range. In addition, the resonant tunneling injection scheme in the present invention allows the same type of carrier emitter/collector (n- or p-type) to be located in the two ends of a device, making cascade photon emission possible by periodically stacking many repeated QW regions separated by a gap-graded cladding region which serves as the collector for one pair of active QWs and the emitter for the next pair.

BRIEF DESCRIPTION OF THE DRAWINGS

The invention, as exemplified by a preferred embodiment, is described with reference to the drawings in which.

DETAILED DESCRIPTION OF THE INVENTION

Figure 1:
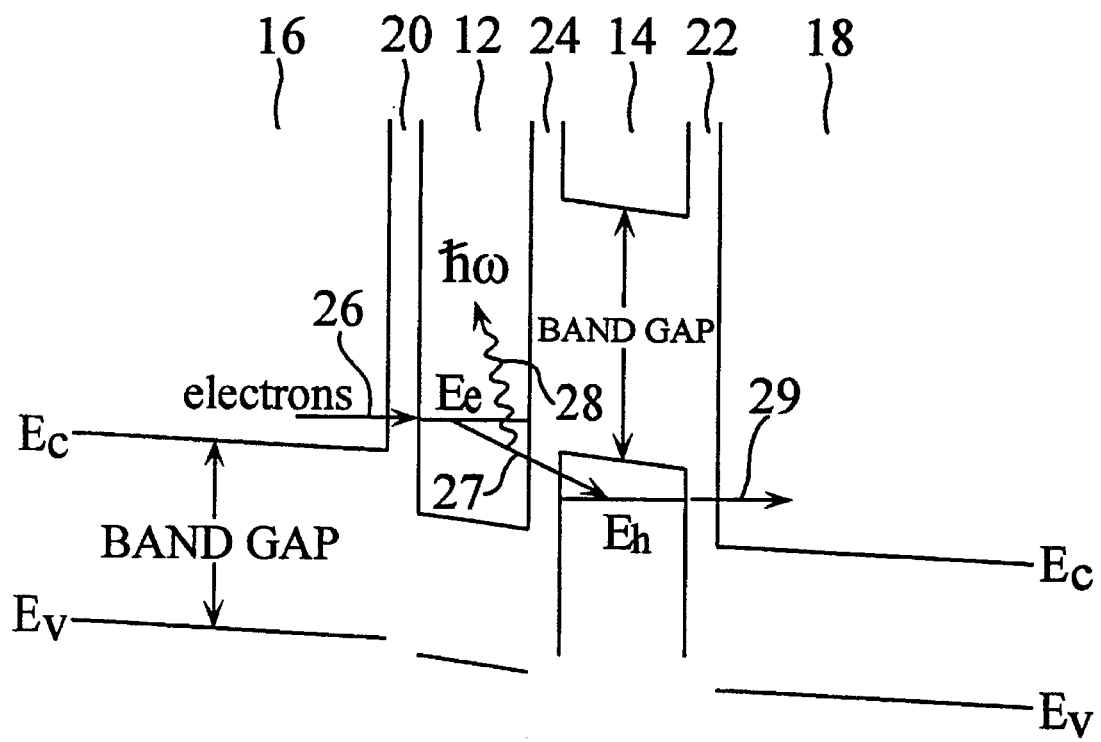
FIG. 1 is a schematic illustration of the energy band profile of an elementary light emitting device of the present invention in a forward biased state.

Referring to the drawings, FIG. 1 is a schematic illustration of the energy band profile of an elementary light emitting device in a forward biased state useful in explaining the invention. The device of FIG. 1 comprises a first QW active region 12 and a second QW active region 14 sandwiched between a first cladding layer 16 and a second cladding layer 18. The conduction band-edge of the first QW active region 12 is lower than the valence band-edge of the second QW active region 14. Cladding layer 16 is separated from the first QW active region 12 by tunnel barrier 20 and cladding layer 18 is separated from the second QW active region 14 by tunnel barrier 22. The first QW region 12 is separated from the second QW region 14 by tunnel barrier 24 which can be zero thickness. The band edges of barrier layers 20, 22 and 24 are not shown and may vary for particular material systems, but it should be understood that their band-gaps must be wide enough to provide the necessary carrier confinement. Barrier layers 20, 22 and 24 can vary in thickness, but should be thin enough so that carriers can tunnel through the layers.

As shown in FIG. 1, at least one ground energy state $E_e$ is formed in the conduction band of the first QW region 12 and one ground energy state $E_h$ which is lower than $E_e$ in energy is formed in the valence band of the second QW region 14. The energy state $E_e$ resides in the band-gap of the second QW region 14 and simultaneously in the conduction band of the cladding layer 16. The energy state $E_h$ resides in the band-gap of the cladding layer 16 and simultaneously in both conduction bands of the cladding layer 18 and the first QW region 12. This allows a finite penetration of the wave-function for state $E_h$ into the conduction band of the first QW region 12, which can enhance the spatial overlap between states $E_e$ and $E_h$ and is beneficial to the optical transition between the two states. In FIG. 1, both cladding layers 16 and 18 are made of n-doped semiconductor materials, which serve as the electron emitter and collector respectively. The first cladding layer 16, the tunnel barrier 20 and the first QW layer 12 form a type-I tunnel junction. The second QW layer 14, the tunnel barrier 22 and the second cladding layer 18 form a type-II tunnel junction. A type-I tunnel junction is such that the conduction band-edge of the emitter is higher in energy than the conduction band-edge of the collector. In addition, a type-I tunnel junction is formed with the conduction band-edge of the collector higher in energy than the valence band-edge of the emitter. In contrast, in type-II tunnel junctions, the valence band-edge of the emitter is higher in energy than the conduction band-edge of the collector or alternatively the conduction band edge of the emitter is lower in energy than the valence band-edge of the collector.

Under an appropriate forward bias, i.e. the cladding layer 18 biased positively with respect to the cladding layer 16, electrons will tunnel through from the conduction band of layer 16 through layer 20 to the energy state $E_e$ as depicted by arrow 26. The electrons in the state $E_e$ can hardly tunnel directly through to the layer 18 because state $E_e$ resides in the band-gap of layer 14 which is thick enough to efficiently block the direct tunneling of the electrons at state $E_e$. The electrons relax to state $E_h$ as depicted by arrow 27. The relaxation results in the emission of electromagnetic radiation depicted by arrow 28 of energy $\eta\omega$. The wavelength of the emitted light will be inversely proportional to the energy difference $E_e$–$E_h$, which can be easily tuned in a broad spectral range (e.g. from mid- to far-IR). The recombined electrons in state $E_h$ then tunnel through layer 22 to the cladding layer 18 as depicted by arrow 29. This is the only path for the electrons in state $E_h$ leaving state $E_h$ since $E_h$ resides in the band-gap of layer 16 preventing electrons from tunneling back to 16. Since states $E_e$ and $E_h$ are localized mainly in layer 12 and layer 14 respectively, the relaxation between the two states can be easily manipulated to be much slower than the tunneling process for carriers from layer 14 to layer 18, facilitating the establishment of sufficient population inversion between the two states. Furthermore, because the electrons relax from a conduction band state to a valence band state, in contrast to the transition between two conduction states in the quantum cascade laser as described by Faist et al. in Science, Vol. 264, Apr. 22, 1994, and the intrawell intersubband transitions as shown by Yang et al. in Appl. Phys. Lett. Vol. 59 (2), 1994, the non-radiative relaxation via the phonon scattering will be greatly suppressed and a higher radiative efficiency can be achieved in the device of the present invention. Thus, both efficient optical transitions and near 100% carrier injection efficiency can be easily achieved with a light emitting device formed with the band-edge alignments and energy state arrangements in accordance with the present invention.

Figure 2:
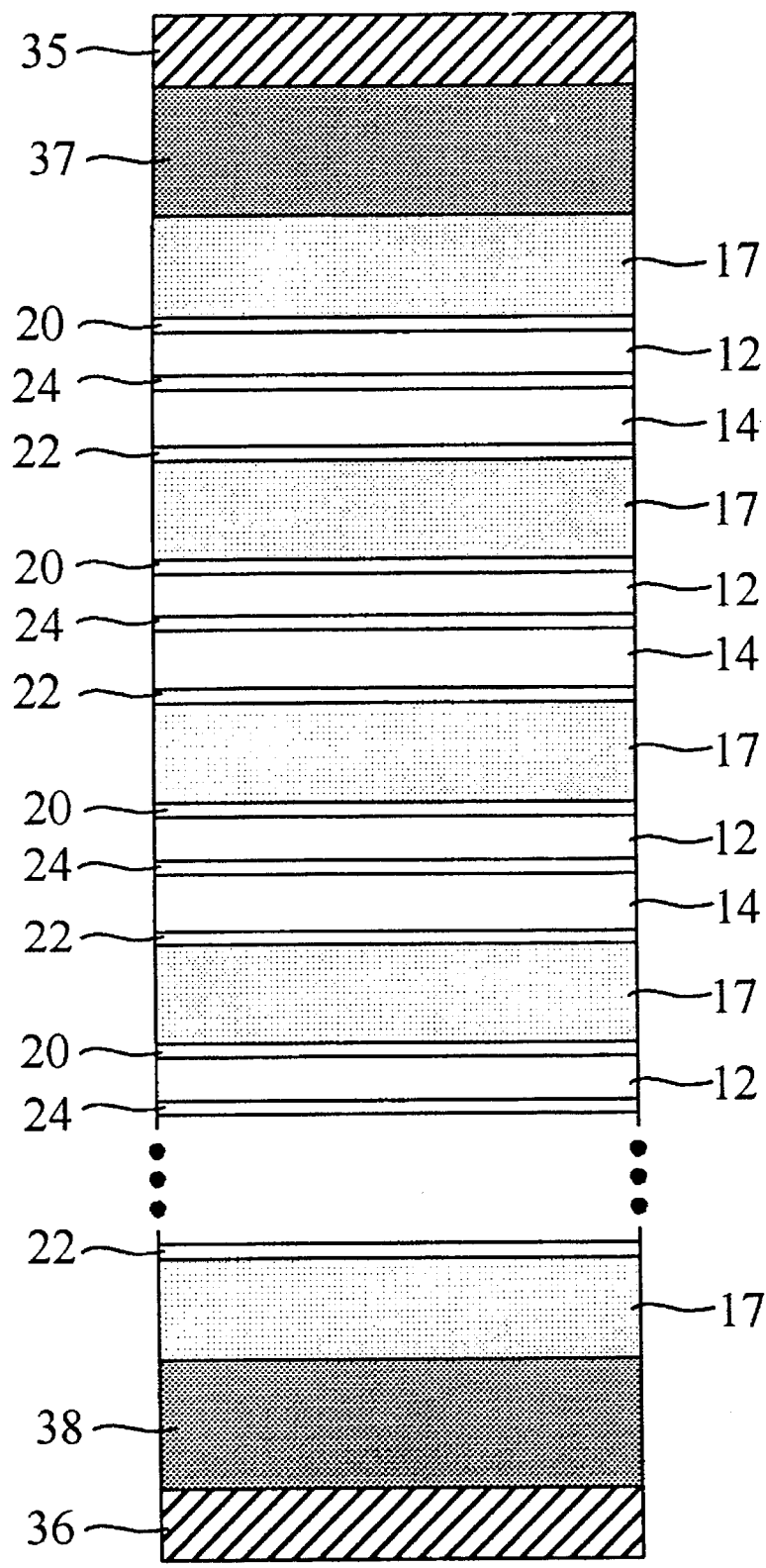
FIG. 2 is a cross-sectional view of an edge of a light emitting device of the present invention.
Figure 3:
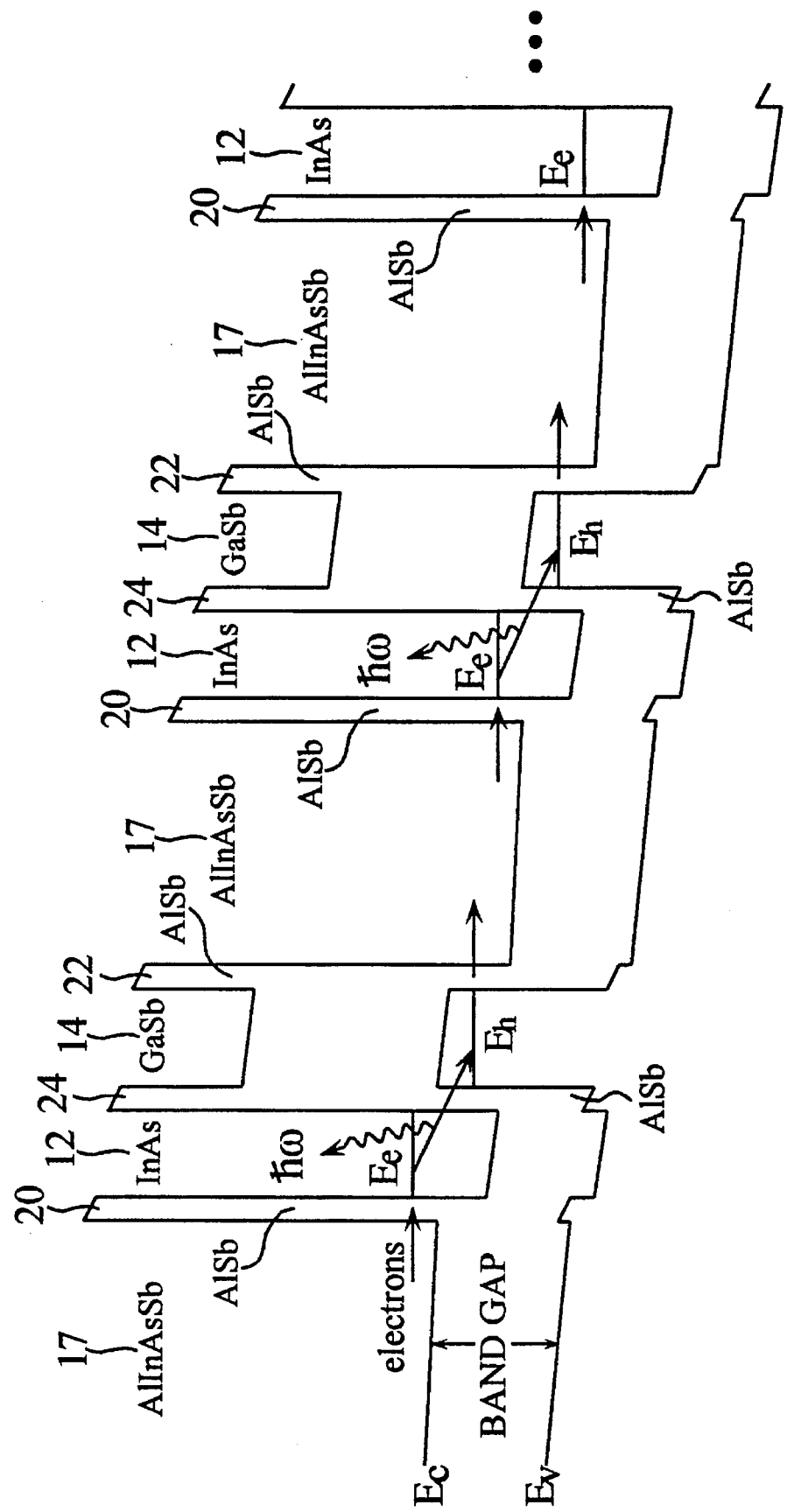
FIG. 3 is a schematic illustration of the energy band profile of a specific embodiment of the light emitting device with n-type emitters/collectors in a forward biased state according to the present invention.

A further embodiment includes integrating many elementary device structures into a superlattice structure as shown in FIG. 2 by periodically stacking repeated QW regions separated by a gap-graded cladding region 17 which serves as the collector for one pair of QWs and the emitter for the next pair. Heavily doped electrode contact layers 35 and 36 are provided at the top and bottom of the superlattice structure as shown in FIG. 2. Additional cladding layers 37 and 38 are inserted adjacent to the layers 35 and 36 respectively as shown in FIG. 2. The refractive indexes of the cladding layers 37 and 38 are lower than the average refractive index of the QW regions and the regions 17 so that light is confined in the region between the cladding layers 37 and 38, as is conventional in such light-emitting devices. Such a specific preferred light emitting device structure with n-type emitter/collectors in a forward biased state is illustrated in a nearly lattice-matched InAs/AlSb/GaSb type-II QW system as shown in FIG. 3. The cladding region 17 can be constructed by either analog graded quaternary AlInAsSb alloy material or digitally graded binary InAs/AlSb alloy superlattice. The conduction band-edge of layer 17 which is n-doped is nearly flat in an appropriate forward bias. The QW layer 14, the adjacent tunnel barrier 22 and the adjacent layer 17 form a type-II tunnel junction. Layer 17, the adjacent tunnel barrier 20 and the adjacent QW layer 12 form a type-I tunnel junction. Each layer in the quantum well regions can vary in thickness, providing great design flexibility. In each period, since the valence band edge of GaSb is higher in energy than the conduction band edge of InAs by about 0.15 eV, strong spatial coupling between the conduction band in the InAs layer 12 and the valence band in the GaSb layer 14 exists in the coupling window region defined between the conduction band edge of InAs and the valence band edge of GaSb. Under a forward bias, the whole band-edge diagram of the device looks like an energy staircase in which an electron tunnels from the layer 17 through the barrier 20 to state $E_e$ in QW layer 12, and relaxes to the lower energy state $E_h$ in the neighboring QW layer 14 causing the emission of a photon with an energy $E_e-E_h$, and then tunnels from state $E_h$ through the barrier 22 to the next layer 17 and on towards another period of stairs, leading to cascade photon emission, which will further improve the device performance.

The emission wavelength, determined by the energy separation between the two states, can be entirely tailored by adjusting the InAs and GaSb well layer thicknesses, over a wide spectral range from the mid-IR to the submillimeter wave region (~100 μm). The short wavelength cutoff (~2 μm) is limited by the conduction band-offset between InAs and GaSb. However, a shorter wavelength in the near IR spectrum including the important 1.3 μm and 1.55 μm for optical fiber communication can be realized by using a further wider band-gap material AlGaSb instead of GaSb. In addition, the transition rate and spectrum can be manipulated by varying the AlSb barrier thickness between InAs and GaSb well layers to change the spatial overlap of wave-functions for the two states, providing a mean to the optimization of device performance.

Figure 4:
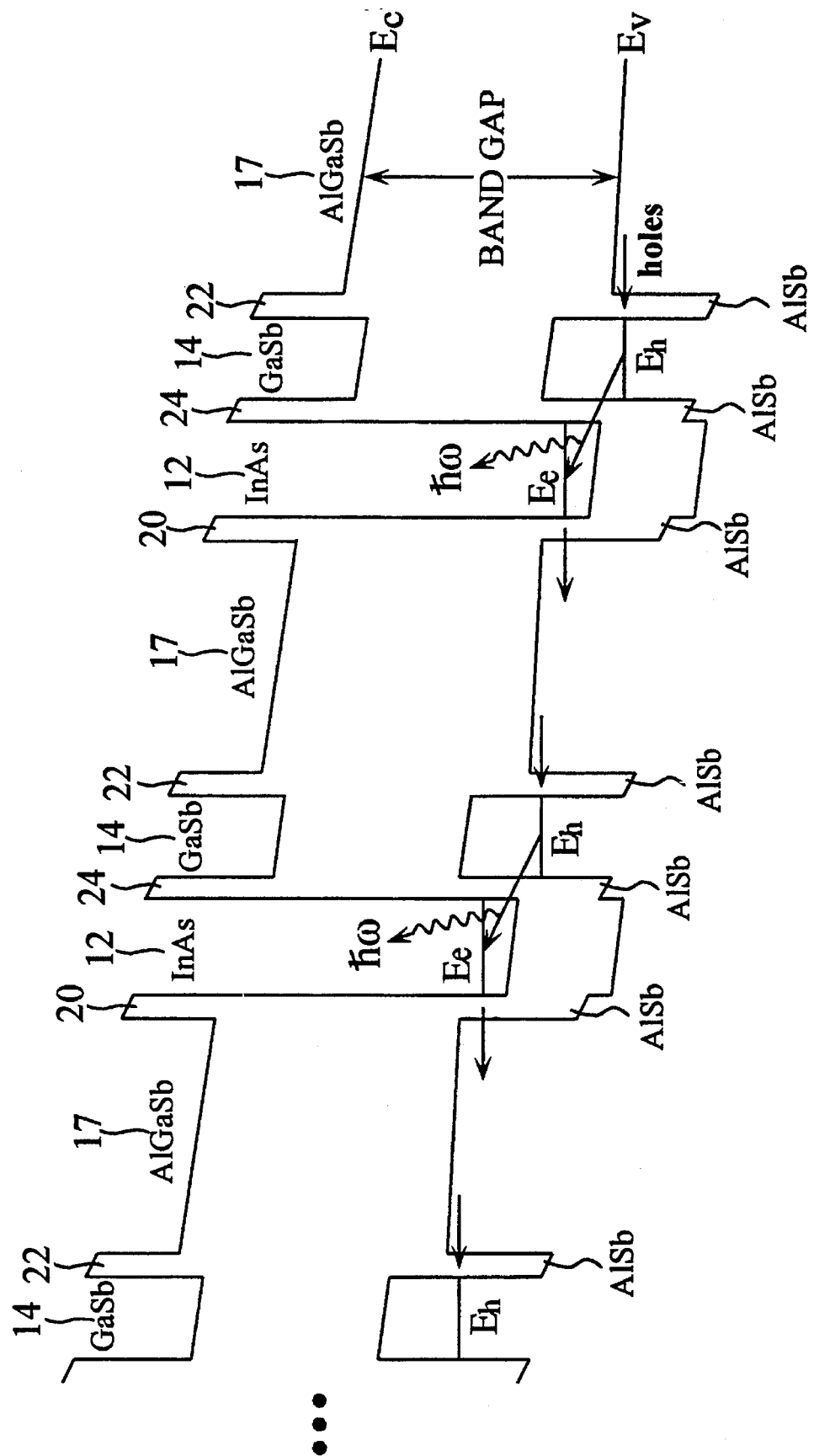
FIG. 4 is a schematic illustration of the energy band profile of a specific embodiment of the light emitting device with p-type emitters/collectors in a forward biased state according to the present invention.

The preferred embodiment of the invention has been described above, in which the cladding layers are made of n-doped semiconductor materials, i.e. both the emitter and collector are n-type. However, several variations of the elementary device structure can be made possible by using either two p-type cladding layers or one n-type cladding layer and one p-type cladding layer with an appropriate rearrangement of energy states $E_e$ and $E_h$ in respect to the band-edge alignment of the whole structure without departing from the spirit of the invention. In one embodiment, a similar structure to that of FIG. 3 is provided but having p-doped analog graded AlGaSb as the cladding layer 17 instead of n-doped AlInAsSb, in which the valence band-edge of the AlGaSb cladding layer 17 is nearly flat under an appropriate forward bias. In this embodiment as shown in FIG. 4, the InAs layer 12, the adjacent tunnel barrier 20 and the adjacent AlGaSb cladding layer 17 form a type-II tunnel junction, and AlGaSb cladding layer 17, the adjacent tunnel barrier 22 and the adjacent GaSb layer 14 form a type-I tunnel junction. Upon applying a forward bias to this device, holes tunnel from the valence band of AlGaSb layer 17 through the adjacent AlSb barrier layer 22 to the energy state $E_h$ residing in the band-gap of the adjacent InAs QW layer 12 and simultaneously in the valence band of the adjacent AlGaSb cladding layer 17, the holes then relax to the energy state $E_e$ residing in both valence bands of the adjacent AlGaSb cladding layer and the adjacent GaSb QW layer 14 and simultaneously in the band-gap of the second adjacent AlGaSb cladding layer, causing the emission of photons.

In accordance with the present invention, the light emitting devices utilize spatially-diagonal transitions between an energy state in the conduction band of one QW and an energy state in the valence band of the adjacent QW rather than intersubband transitions within a conduction band (or valence band). The utilization of the energy states in this manner, together with the unique band-edge alignment of the layers and the resonant tunneling injection, allows for a great improvement in both radiative efficiency and carrier injection efficiency, and facilitates achieving a sufficient population inversion. Additionally, the emission wavelength can be more easily customized by selecting material system and thicknesses with much tolerance to create the desired energy difference between the two states.

The QW light-emitting devices can be manufactured by any known processes for creating semiconductor devices, such as the growth of epitaxial layers on a substrate. One of the most widely used and versatile techniques for growing epitaxial layers is molecular beam epitaxy (MBE). For example, by using MBE a light-emitting device comprising a superlattice structure as shown in FIG. 4 is grown on a GaSb substrate in a sequence from the bottom to the top as shown in FIG. 2. Layers 35, 36, 37 and 38 are chosen to be p-type doped. The thickness of layers 12, 14, 20, 22 and 24 in FIG. 4 are: 10 nm, 1.9 nm, 2.5 nm, 2 nm and 0, respectively. This construction and combination of thicknesses produces emitted light with a wavelength of 10 micrometers.

Although the invention has been specifically described and illustrated with respect to the preferred embodiments which can represent applications of the principles of the invention, it should be understood by those skilled in the art that all variations and modifications in form and details may be made therein without departing from the spirit and scope of the invention which should be limited only by the scope of the claims.

What is claimed is:

1. A light emitting device comprising:
    a first cladding region of semiconductor material having conduction and valence allowed energy bands defined by corresponding band edges spaced apart by an energy band-gap;
    a second cladding region of semiconductor material having conduction and valence allowed energy bands defined by corresponding band edges spaced apart by an energy band-gap;
    a first quantum well region of semiconductor material having conduction and valence allowed energy bands defined by corresponding band edges spaced apart by an energy band-gap, said first quantum well region which is adjacent to said first cladding region having at least one energy state residing in said conduction band of said first quantum well region; and
    a second quantum well region of semiconductor material having conduction and valence allowed energy bands defined by corresponding band edges spaced apart by an energy band-gap, said second quantum well region sandwiched between said first quantum well region and second cladding region, said first and second quantum well regions forming a type-II heterojunction, said second quantum well region having at least one energy state which is lower in energy than said energy state in said conduction band of said first quantum well region and is within said valence band of said second quantum well region, under a bias voltage each of said energy states residing within said allowed energy bands of said adjacent cladding region and simultaneously residing within at least one of the band-gaps of said adjacent quantum well region and the other cladding region.

2. The light emitting device of claim 1 further including means for applying a bias to said device sufficient to cause emission of electromagnetic energy between said energy state in the conduction band of said first quantum well region and said energy state in the valence band region of said second quantum well region.

3. The light emitting device of claim 1 wherein said first quantum well region is InAs and said second quantum well region is GaSb.

4. The light emitting device of claim 1 further including a first tunnel barrier disposed between said first cladding region and said first quantum well region and a second tunnel barrier between said second cladding region and said second quantum well region.

5. The light emitting device of claim 4 wherein said first and second tunnel barriers are each comprised of a layer of semiconductor material having a band-gap wider than the band-gap of said adjacent quantum well region to provide carrier confinement and to act as an insulator, said first and second barriers being sufficiently thin to permit carrier tunneling.

6. The light emitting device of claim 4 wherein said first cladding region, said first tunnel barrier and said first quantum well region form a type-I tunnel junction and wherein said second quantum well region, said second tunnel barrier and said second cladding region form a type-II tunnel junction.

7. The light emitting device of claim 6 wherein said first and second cladding regions are each comprised of an analog graded quaternary AlInAsSb alloy layer or digitally graded InAs/AlSb superlattice, and wherein said first tunnel barrier, said first quantum well region, said second quantum well region and said second tunnel region are AlSb/InAs/GaSb/AlSb, respectively, under said bias voltage said energy state in the conduction band of said InAs residing within the conduction band of said first cladding region and simultaneously residing within the band-gap of said GaSb and said energy state in the valence band of said GaSb residing within the conduction bands of said InAs and said second cladding region and simultaneously within the band-gap of said first cladding region.

8. The light emitting device of claim 4 wherein said first cladding region, said first tunnel barrier and said first quantum well region form a type-II tunnel junction and wherein said second quantum well region, said second tunnel barrier and said second cladding region form a type-I tunnel junction.

9. The light emitting device of claim 8 wherein said first and second cladding regions are each comprised of an analog graded ternary AlGaSb alloy layer or digitally graded GaSb/AlSb superlattice, and wherein said first tunnel barrier, said first quantum well region, said second quantum well region and said second tunnel region are AlSb/InAs/GaSb/AlSb, respectively, under said bias voltage said energy state in the conduction band of said InAs residing within the valence bands of said first cladding region and said GaSb and simultaneously residing within the band-gap of said second cladding region and said energy state in the valence band of said GaSb residing within the band-gap of said InAs and simultaneously within the valence band of said second cladding region.

10. The light emitting device of claim 4 wherein said first cladding region, said first tunnel barrier and said first quantum well region form a type-I tunnel junction and wherein said second quantum well region, said second tunnel barrier and said second cladding region form a type-I tunnel junction.

11. The light emitting device of claim 10 wherein said first cladding region, said first tunnel barrier, said first quantum well region, said second quantum well region, said second tunnel region and said second cladding region are InAs/AlSb/InAs/GaSb/AlSb/GaSb, respectively.

12. The light emitting device of claim 1 further including a tunnel barrier disposed between said first and said second quantum well regions.

13. The light emitting device of claim 12 wherein said tunnel barrier is comprised of a layer of semiconductor material having a thickness selected to manipulate the spatial interband coupling between said first and second quantum well regions, said barrier being sufficiently thin to permit carrier tunneling.

14. The light emitting device of claim 1 further comprising a plurality of the device of claim 1 stacked in series to form a superlattice structure so as to produce cascade photon emissions.

15. The light emitting device of claim 4 further comprising a plurality of the device of claim 4 stacked in series to form a superlattice structure so as to produce cascade photon emissions.

16. The light emitting device of claim 6 further comprising a plurality of the device of claim 6 stacked in series to form a superlattice structure so as to produce cascade photon emissions.

17. The light emitting device of claim 7 further comprising a plurality of the device of claim 7 stacked in series to form a supeflattice structure so as to produce cascade photon emissions.

18. The light emitting device of claim 8 further comprising a plurality of the device of claim 8 stacked in series to form a superlattice structure so as to produce cascade photon emissions.

19. The light emitting device of claim 9 further comprising a plurality of the device of claim 9 stacked in series to form a superlattice structure so as to produce cascade photon emissions.

20. The light emitting device of claim 10 further comprising a plurality of the device of claim 10 stacked in series to form a superlattice structure so as to produce cascade photon emissions.

21. The light emitting device of claim 12 further comprising a plurality of the device of claim 12 stacked in series to form a superlattice structure so as to produce cascade photon emissions.

\* \* \* \* \*